United States Patent
Braunstorfinger

(10) Patent No.: US 12,143,248 B2
(45) Date of Patent: Nov. 12, 2024

(54) CLOUD-BASED SIGNAL GENERATOR SYSTEM AND METHOD FOR PROVIDING A SIGNAL

(71) Applicant: Rohde & Schwarz GmbH & Co. KG, Munich (DE)

(72) Inventor: Thomas Braunstorfinger, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 19 days.

(21) Appl. No.: 16/886,988

(22) Filed: May 29, 2020

(65) Prior Publication Data

US 2021/0377081 A1  Dec. 2, 2021

(51) Int. Cl.
*H04L 25/03* (2006.01)
*G01R 31/28* (2006.01)
*H04L 67/10* (2022.01)

(52) U.S. Cl.
CPC .... *H04L 25/03859* (2013.01); *G01R 31/2841* (2013.01); *H04L 67/10* (2013.01)

(58) Field of Classification Search
CPC .............. H04L 25/03859; H04L 67/10; G01R 31/2841
USPC ......................................................... 702/124
See application file for complete search history.

(56) References Cited

U.S. PATENT DOCUMENTS

| | | | |
|---|---|---|---|
| 7,634,815 B2 | 12/2009 | Kumaki et al. | |
| 2003/0081768 A1* | 5/2003 | Caminschi | G06F 21/121 380/2 |
| 2006/0200512 A1* | 9/2006 | Kumaki | G01R 31/3183 708/270 |
| 2008/0114563 A1* | 5/2008 | Kappauf | G01R 31/319 702/124 |
| 2009/0086873 A1* | 4/2009 | Obata | G01R 31/31709 375/371 |
| 2013/0266052 A1* | 10/2013 | Yang | H04B 17/29 375/224 |
| 2014/0167953 A1* | 6/2014 | Dunlop | G09B 19/00 340/515 |

(Continued)

FOREIGN PATENT DOCUMENTS

WO   2007/116535 A1   10/2007

*Primary Examiner* — Suraj M Joshi
*Assistant Examiner* — Ayele F Woldemariam
(74) *Attorney, Agent, or Firm* — CHRISTENSEN O'CONNOR JOHNSON KINDNESS PLLC

(57) ABSTRACT

A cloud-based signal generator system is described. The signal generator system includes a server being connectable to at least one client via a computer communication network. The server includes a waveform definition module. The waveform definition module is configured to receive a user request. The waveform definition module further is configured to process the user request and to generate at least one signal parameter that is associated with a custom waveform based on the user request. The server further includes a waveform verification module. The waveform verification module is configured to analyze the custom waveform based on the at least one signal parameter, thereby generating waveform analysis data. The waveform verification module is configured to forward the waveform analysis data to the at least one client. Further, a method for providing a signal including a custom waveform is described.

21 Claims, 3 Drawing Sheets

(56) References Cited

U.S. PATENT DOCUMENTS

| | | | | |
|---|---|---|---|---|
| 2014/0254647 | A1* | 9/2014 | Stott | H04L 43/12 |
| | | | | 375/224 |
| 2019/0206203 | A1* | 7/2019 | Takeuchi | H04M 3/42 |
| 2019/0383873 | A1* | 12/2019 | Hojabri | G01R 31/3171 |
| 2020/0296550 | A1* | 9/2020 | Akkarakaran | G01S 5/0036 |
| 2020/0363471 | A1* | 11/2020 | Mandyam Krishnakumar | |
| | | | | G01R 31/31707 |

* cited by examiner

CLOUD-BASED SIGNAL GENERATOR SYSTEM AND METHOD FOR PROVIDING A SIGNAL

FIELD OF THE DISCLOSURE

Embodiments of the present disclosure generally relate to a cloud-based signal generator system. Embodiments of the present disclosure further relate to a method for providing a signal comprising a custom waveform.

BACKGROUND

Standalone signal generators and measurement instruments with a built-in signal generator are used in various technical fields in order to assess the performance of a device under test.

For example, signal generators are used for testing mobile communication equipment, particularly mobile communication equipment according to the 5G communication standard.

For the assessment of the performance of the device under test, a test signal having a predefined waveform is generated via the signal generator, and a response of the device under test to the test signal is measured.

Therein, the predefined waveform of the test signal may have to be tailored to the specific device under test, e.g. with regard to the frequency content and the modulation of the test signal, such that the test signal is suitable for assessing the performance of the specific device under test.

Generating suitable waveforms is a rather time-consuming process, as the test signal needs to be adjusted to meet the specifications of the particular device under test.

Accordingly, there is a need for a signal generator system and a method for providing a signal that allow for a more convenient acquisition of waveforms for signal generators.

SUMMARY

Embodiments of the present disclosure provide a cloud-based signal generator system. In an embodiment, the signal generator system comprises a server being connectable to at least one client via a communication network, such as a computer communication network. The server comprises a waveform definition circuit or module. The waveform definition module is configured to receive a user request. The waveform definition module further is configured to process the user request and to generate at least one signal parameter that is associated with a custom waveform based on the user request. The server further comprises a waveform verification circuit or module. The waveform verification module is configured to analyze the custom waveform based on the at least one signal parameter, thereby generating waveform analysis data. The waveform verification module is configured to forward the waveform analysis data to the at least one client.

Therein, the computer communications network is established as any type of suitable network connecting the client and the server, for instance a local area network (LAN), a wide area network (WAN), etc. In some embodiments, the computer network is part of the internet or World Wide Web (WWW).

It is noted that the cloud-based signal generator system may comprise several servers that are located at different geographic locations (e.g., the servers may form a cloud or remote computing system).

A user may send a request for a custom waveform, namely the user request, to the server. The server, or more precisely the waveform definition module processes the user request and generates the at least one signal parameter, wherein the custom waveform associated with the at least one signal parameter is tailored to the particular demands comprised in the user request. In other words, a custom waveform is generated according to the demands of the user.

The at least one signal parameter is established such that a client-side signal generator can reproduce the custom waveform based on the at least one signal parameter.

Accordingly, a set of signal parameters may be generated by the waveform definition module, wherein the set of signal parameters fully describes the custom waveform. For example, the set of signal parameters may comprise a set of waveform samples that correspond to the custom waveform.

In some embodiments, the at least one signal parameter is not directly forwarded to the client. Instead, the custom waveform is analyzed by the waveform verification module first, which generates the waveform analysis data associated with the custom waveform.

Generally speaking, the waveform analysis data comprises information on properties of the custom waveform, e.g. a modulation type, a frequency content, a signal to noise ratio, a jitter content, and/or a noise content etc.

Based on the analysis data, the user may decide whether the generated custom waveform is actually suitable for the requirements of a particular test setup.

If the custom waveform meets the requirements, the user may decide to order and pay for that particular waveform based on the waveform analysis data. Thus, the user can make an informed decision and only has to pay for the particular custom waveform requested. The user may pay for the custom waveform before or after the at least one signal parameter is transferred to the client.

If, however, the custom waveform does not meet the requirements, the user may send another user request in order to modify the custom waveform without having to pay for the previously generated custom waveform (which did not fully meet the requirements).

Thus, the cloud-based signal generator system according to the disclosure provides a convenient way of acquiring custom waveforms, wherein the user can adapt the custom waveform until the requirements of a particular test setup are met in a satisfying manner Therefore, the user only has to pay for the final custom waveform that is ordered. Moreover, it is ensured that the user obtains a custom waveform that fulfills the respective requirements.

According to an aspect of the present disclosure, the at least one signal parameter is uniquely associated with the custom waveform. Thus, the custom waveform can be reproduced based on the at least one signal parameter unambiguously. Accordingly, a client-side signal generator can reproduce the custom waveform based on the at least one signal parameter or based on the set of signal parameters associated with the custom waveform.

According to another aspect of the present disclosure, the server is configured to receive a user confirmation from the client, wherein the waveform definition module is configured to forward the at least one signal parameter to the client based on the user confirmation. The user may send the user confirmation to the server if the custom waveform meets the requirements of a particular measurement setup. In other words, the user may order the custom waveform by the user confirmation. The user may pay for the custom waveform before or after the at least one signal parameter is transferred to the client. In some embodiments, a payment may be part of the user confirmation.

In a further embodiment of the present disclosure, the waveform definition module comprises a memory, wherein the waveform definition module is configured to store the at least one signal parameter in the memory. Thus, the at least one signal parameter may be stored in the memory for later use. For example, the least one signal parameter may be stored in the memory until a user confirmation for confirming the order is received or until the user deletes the user request.

Moreover, a history of previous user requests and the respectively associated signal parameters may be stored in the memory, such that the user can access previously requested custom waveforms in a convenient manner (i.e. without having to re-enter all specifications of the user request).

According to another aspect of the present disclosure, the waveform definition module is configured to load the at least one signal parameter from the memory. This way, a previous session, i.e. a custom waveform associated with a previous user request, may be restored, e.g. if a user did not send a user confirmation for the previous custom waveform.

If the user has confirmed an order of a waveform, the custom waveform or rather the at least one signal parameter associated with that custom waveform may be available for download form the server for a predefined time period. In other words, the user may pay for a subscription for downloading a particular custom waveform, and may download the at least one signal parameter associated with that particular custom waveform at any time during the predefined time period.

Moreover, the at least one signal parameter is stored in the memory only for a predefined time period in some embodiments. Alternatively, the at least one signal parameter stored becomes invalid once the time period has expired. Accordingly, the user will have to re-order the respective waveform in order to download the at least one signal parameter again or to re-activate the at least one signal parameter stored.

In a further embodiment of the present disclosure, the waveform verification module is configured to load the at least one signal parameter from the memory. Thus, the waveform verification module may restore a previous session or may directly access the current session, i.e. the at least one signal parameter associated with the current user request.

According to a further aspect of the present disclosure, the at least one signal parameter comprises at least one IQ parameter. In some embodiments, the at least one signal parameter comprises a full set of IQ-data, i.e. in-phase data (I-data) and quadrature data (Q-data). The full set of IQ-data may fully describe the custom waveform, such that the custom waveform can be reproduced based in the set of IQ-data.

In some embodiments, the waveform definition module comprises a user interface. In some embodiments, the user request is received via the user interface. The user may enter signal parameters of the signal to be generated (i.e. the custom waveform to be generated) via the user interface.

The user interface of the waveform definition module may be implemented into a website that is accessible via a browser. In other words, the user interface of the waveform definition module may be established as a web-based user interface. The web-based user interface is accessible via the web, for example the internet.

The user interface of the waveform definition module may be displayed on a monitor or a display of a client-side computing device, e.g. on a monitor connected with a personal computer, on a display of a laptop, on a display of a measurement instrument and/or on display of a standalone signal generator. Moreover, the display may be associated with a user equipment such as a mobile phone that is configured appropriately. For instance, a respective application runs on the user equipment, providing the user interface.

The waveform verification module may comprise a user interface. The waveform analysis data may be displayed via the user interface of the waveform verification module.

The user interface of the waveform verification module may be implemented into a website that is accessible via a browser or an application running on a computing device. In other words, the user interface of the waveform verification module may be established as a web-based user interface.

The user interface of the waveform verification module may be displayed on a monitor or a display of a client-side computing device, e.g. on a monitor connected with a personal computer, on a display of a laptop, on a display of a measurement instrument and/or on display of a standalone signal generator. Moreover, the display may be associated with a user equipment such as a mobile phone that is configured appropriately. For instance, a respective application runs on the user equipment, providing the user interface.

According to an aspect of the present disclosure, the user request comprises an identification quantity, wherein the identification quantity is unambiguously associated with a particular signal generator or with a particular type of signal generators. The identification quantity may comprise a serial code of the signal generator or a serial code of the type of signal generators. Alternatively or additionally, the identification quantity may comprise a product name that is associated with the signal generator or with the type of signal generators.

According to another aspect of the present disclosure, the waveform definition module is configured to generate the at least one signal parameter based on the identification quantity. Thus, the at least one signal parameter may be adapted to the particular signal generator or the particular type of signal generators used by the user sending the user request, such that the at least one signal parameter is compatible with the signal generator or with the type of signal generators.

Alternatively or additionally, the custom waveform or rather the at least one signal parameter associated with the custom waveform may be locked to a particular signal generator or locked to several signal generators based on the identification quantity, such that the custom waveform may only be generated by that signal generator or that several signal generators. In other words, the user may decide to restrict the custom waveform to be operable only on one or several signal generators, but may pay a lower price for the restricted custom waveform.

Similarly, the user may decide to restrict the custom waveform to be operable only for a predefined time period, but may pay a lower price for the time-restricted custom waveform.

The restriction to a particular signal generator and/or the restriction to a particular time period may be coded into the at least one signal parameter.

In a further embodiment of the present disclosure, the client comprises a signal generator, wherein the signal generator is configured to generate an output signal comprising the custom waveform based on the at least one signal parameter. The client-side signal generator may be integrated into a measurement instrument, e.g. an oscilloscope or a vector network analyzer. Alternatively, the client-side signal generator may be established as a standalone signal generator.

The client may download the custom waveform or rather the at least one signal parameter associated with the custom waveform from the server. The custom waveform or rather the at least one associated signal parameter may be stored in a memory of a client-side computing device and/or in a memory of the client-side signal generator.

In some embodiments, the at least one signal parameter and/or the custom waveform are stored in the memory of the client-side computing device and/or in the memory of the client-side signal generator together with the identification quantity described above.

According to another aspect of the present disclosure, the waveform definition module is configured to adapt the at last one signal parameter in real time, wherein the waveform verification module is configured to adapt the waveform analysis data in real time. Thus, the waveform verification module may analyze the custom waveform and generate the associated waveform analysis data in real time, such that the user can immediately see the result of changes requested via another user request or rather a modified user request.

Therein and in the following, the term "real time" is understood to also comprise latencies that are noticeable by the user. In other words, the waveform verification module may adapt the waveform analysis data with a noticeable latency, e.g. if the computations necessary for the adaptation are time-consuming.

Embodiments of the present disclosure further provide a method for providing a signal comprising a custom waveform. In an embodiment, the method comprises the following steps:

receiving a user request from a client via a computer communication network;
processing the user request by a waveform definition circuit or module of a server;
generating at least one signal parameter that is associated with a custom waveform based on the user request by means of the waveform definition module of the server;
analyzing the custom waveform based on the at least one signal parameter by a waveform verification circuit or module of the server, thereby generating waveform analysis data; and
forwarding the waveform analysis data to the client.

In some embodiments, the cloud-based signal generator system described above is configured to perform the method for providing a signal comprising a custom waveform.

Regarding the further properties and advantages of the method, reference is made to the explanations given above with respect to the cloud-based signal generator system, which also hold for the method and vice versa.

According to an aspect of the present disclosure, the at least one signal parameter is uniquely associated with the custom waveform. Thus, the custom waveform can be reproduced based on the at least one signal parameter unambiguously. Accordingly, a client-side signal generator can reproduce the custom waveform based on the at least one signal parameter or based on the set of signal parameters associated with the custom waveform.

According to another aspect of the present disclosure, the at least one signal parameter is forwarded to the client after a user confirmation is received from the client via the computer communication network. The user may send the user confirmation to the server if the custom waveform meets the requirements of a particular measurement setup. In other words, the user may order the custom waveform by the user confirmation. The user may pay for the custom waveform before or after the at least one signal parameter is transferred to the client.

In a further embodiment of the present disclosure, the waveform analysis data is visualized via a user interface of the waveform verification module. The user interface of the waveform verification module may be implemented into a website that is accessible via a browser. In other words, the user interface of the waveform verification module may be established as a web-based user interface.

The user interface of the waveform verification module may be displayed on a monitor or a display of a client-side computing device, e.g. on a monitor connected with a personal computer, on a display of a laptop, on a display of a measurement instrument and/or on display of a standalone signal generator.

In some embodiments, the at least one signal parameter comprises at least one IQ parameter. In some embodiments, the at least one signal parameter comprises a full set of IQ-data, i.e. in-phase data (I-data) and quadrature data (Q-data). The full set of IQ-data may fully describe the custom waveform, such that the custom waveform can be reproduced based in the set of IQ-data.

The user request may comprise an identification quantity, wherein the identification quantity is unambiguously associated with a particular signal generator or with a particular type of signal generators. The identification quantity may comprise a serial code of the signal generator or a serial code of the type of signal generators. Alternatively or additionally, the identification quantity may comprise a product name that is associated with the signal generator or with the type of signal generators.

According to a further embodiment of the present disclosure, the at least one signal parameter is generated based on the identification quantity. Thus, the at least one signal parameter may be adapted to the particular signal generator or the particular type of signal generators used by the user sending the user request, such that the at least one signal parameter is compatible with the signal generator or with the type of signal generator.

Alternatively or additionally, the custom waveform or rather the at least one signal parameter associated with the custom waveform may be locked to a particular signal generator or locked to several signal generators based on the identification quantity, such that the custom waveform may only be generated by that signal generator or that several signal generators. In other words, the user may decide to restrict the custom waveform to be operable only on one or several signal generators, but may pay a lower price for the restricted custom waveform.

Similarly, the user may decide to restrict the custom waveform to be operable only for a predefined time period, but may pay a lower price for the time-restricted custom waveform.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
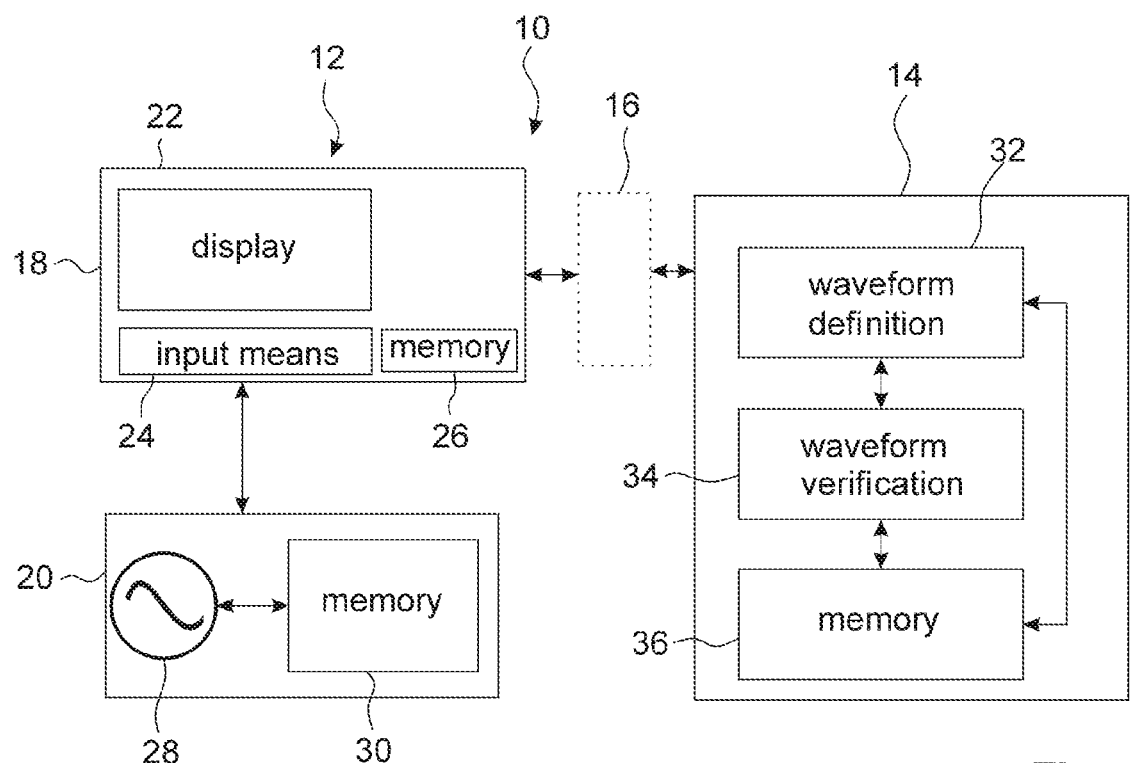
FIG. 1 schematically shows a block diagram of a cloud-based signal generator system according to a first embodiment of the present disclosure.

FIG. 1 schematically shows a cloud-based signal generator system 10 comprising a client 12 and a server 14. The client 12 and the server 14 are connected to each other via a computer network 16. It is noted that the cloud-based signal generator system 10 may comprise several servers 14 that are located at different geographic locations (i.e. the servers 14 may form a cloud or a remote, distributed computer system). Therein and in the following, the term "client" is used as a collective term for all client-side devices.

The computer network 16 may be established as any type of suitable network connecting the client 12 and the server 14, for instance a Wide Area Network (WAN) and/or a Local Area Network (LAN). In some embodiments, the computer network 16 is part of the internet or World Wide Web.

Generally speaking, the cloud-based signal generator system 10 or rather the server 14 is configured to receive a user request for a custom waveform via the computer network 16. The server 14 processes the user request and provides the custom waveform to the client 12. This will be explained in more detail below.

In the particular embodiment of FIG. 1, the client 12 comprises a computing device 18 and a standalone signal generator 20 that are connected to each other in a signal-transmitting manner, for example via a cable or via a wireless connection, such as WLAN or Bluetooth. In some embodiments, the computing device 18 is established as a laptop, as a personal computer, as a smartphone, as a tablet or as any other kind of smart device.

The computing device 18 comprises a display 22. For example, the display 22 is established as a monitor or as an integrated display, for example as a touch-sensitive display. The computing device 18 also comprises one or more inputs 24 via which a user can control the computing device 18. In some embodiments, the inputs 24 comprise a keyboard, a computer mouse, etc. It is noted that the input 24 may be integrated into the display 22 or may be identical with the display 22 if the display 22 is established as a touch-sensitive display, for instance as a capacitive one. The computing device 18 further comprises memory 26, wherein the memory 26 may be established as a non-volatile memory. In an embodiment, one or more processors, CPUs, etc., is connected at least to the display 22, the input(s) 24, and the memory 26.

The standalone signal generator 20 comprises a signal generator unit 28 and a memory 30. The signal generator unit 28 is configured to generate an arbitrary waveform. For example, the signal generator unit 28 is established as a numerically controlled oscillator. The memory 30 may be established as a non-volatile memory.

Still referring to FIG. 1, the server 14 comprises a waveform definition circuit or module 32, a waveform verification circuit or module 34, and a memory 36. The waveform definition module 32 is connected to each of the waveform verification module 34 and the memory 36 in a signal-transmitting manner. Moreover, the waveform verification module 34 is connected to the memory 36 in a signal-transmitting manner. The memory 36 may be established as a non-volatile memory.

As used therein, the term "module" is understood to denote a suitable combination of hardware and/or software configured to perform a certain functionality. The functionality of the individual modules will be described in more detail below. In an embodiment, a module includes combinations of circuits and computer program products having software or firmware instructions stored on one or more computer readable memories that work together to cause a device to perform one or more protocols, methodologies or technologies described herein, or steps thereof. In an embodiment, circuitry includes circuits, such as, for example, one or more microprocessors or portions of a microprocessor, that require software, firmware, and the like for operation.

Figure 2:
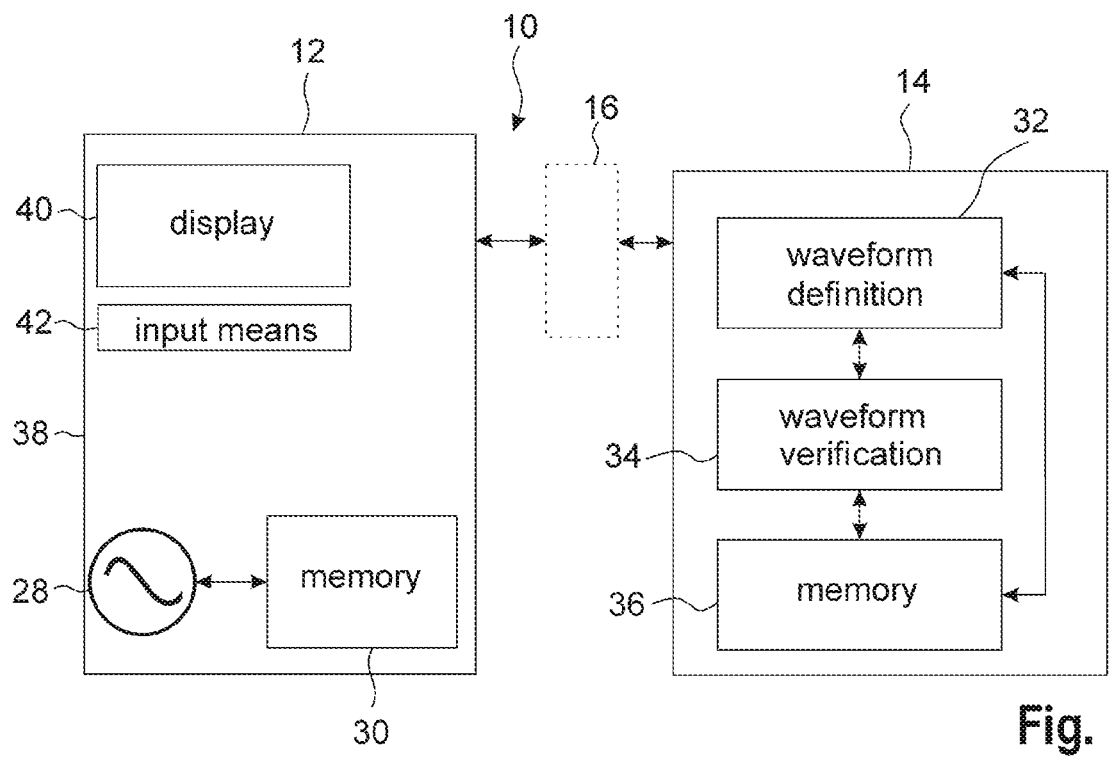
FIG. 2 schematically shows a block diagram of a cloud-based signal generator system according to a second embodiment of the present disclosure.

FIG. 2 shows another embodiment of the cloud-based signal generator system 10, wherein only the differences compared to the embodiment of FIG. 1 will be described in the following.

The signal generator system 10 of FIG. 2 comprises a measurement instrument 38 with an integrated signal generator 28. For example, the measurement instrument 38 may be established as an oscilloscope or as a vector network analyzer.

The measurement instrument 38 comprises a display 40 and one or more inputs 42. It is noted that the input(s) 42 may be integrated into the display 40 or may be identical with the display 40 if the display 40 is established as a touch-sensitive display, for instance as a capacitive one.

It is noted that while no computing device 18 is shown in FIG. 2, this does not mean that no client-side computing device may be connected to the server 14 and/or the measurement instrument 38.

Of course, a computing device, for example the client-side computing device 18 of FIG. 1, may be interconnected between the measurement instrument 38 and the server 14 analogously to the embodiment of FIG. 1. Alternatively, the computing device, for example the client-side computing device 18 of FIG. 1, may be connected to the server 14 in addition to the measurement instrument 38.

Figure 3:
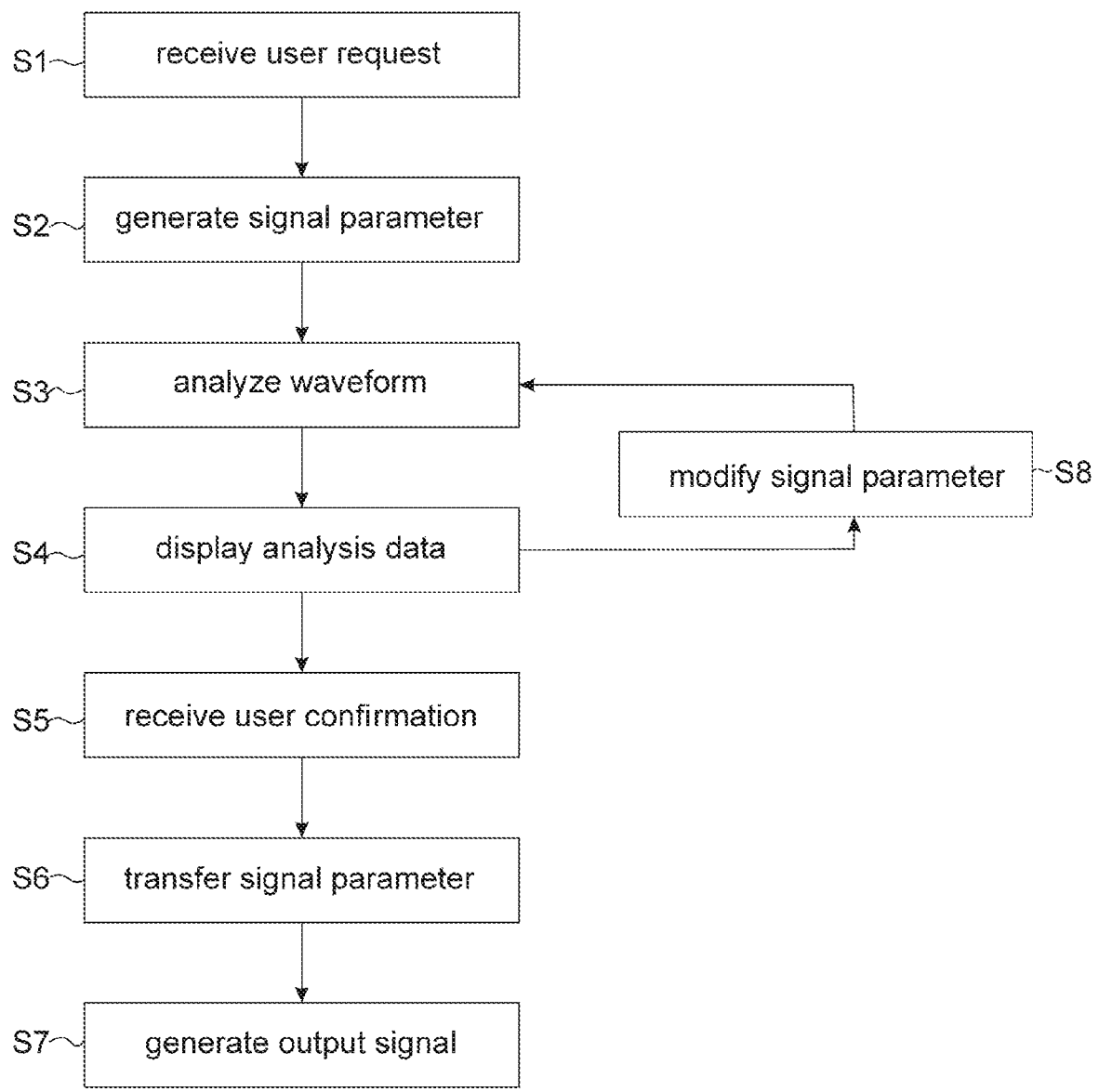
FIG. 3 shows a flow chart of a method for providing a signal comprising a custom waveform according to an embodiment of the present disclosure.

Irrespective of the particular embodiment, the cloud-based signal generator system 10 is configured to perform a method for providing a signal comprising a custom waveform, which method is described in the following with reference to FIGS. 3 and 4.

A user request is received by the server 14 from the client 12 via the computer network 16 (step S1). The user request may be received from the computing device 18 or rather the measurement instrument 38.

In general, the user request is a request for a certain waveform that the user wants to generate via the signal generator unit 28.

For example, the user may need the signal comprising the custom waveform for testing a particular device under test, such as a mobile communication device or a radar device.

Figure 4:
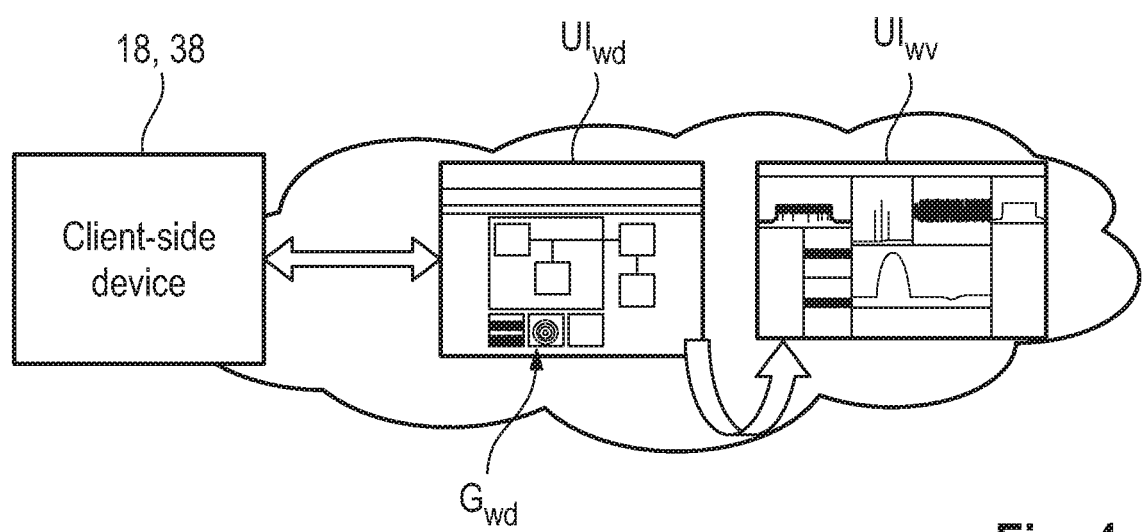
FIG. 4 schematically shows examples of user interfaces of the cloud-based signal generator system of FIG. 1 or FIG. 2.

As is illustrated in FIG. 4, the user may enter the user request via a user interface $UI_{wd}$ of the waveform definition module 32.

The user interface $UI_{wd}$ of the waveform definition module 32 may be implemented via a website that is accessible via a browser of the client 12, namely at client site. In other words, the user interface $UI_{wd}$ of the waveform definition module 32 may be established as a web-based user interface. The user interface $UI_{wd}$ may be displayed on the display 22 of the computing device 18 and/or on the display 40 of the measurement instrument 38, respectively.

The user interface $UI_{wd}$ may comprise suitable forms, checkboxes, drop-down menus, etc. via which the user may enter information on the requested custom waveform. For example, the user may enter a sample rate, a total number of samples, a modulation type, a desired frequency content, a desired signal to noise ratio, a desired jitter content, a desired noise content (e.g. additive white Gaussian noise), etc.

Moreover, the user may be requested to enter an identification quantity that is unambiguously associated with the standalone signal generator 20 or with the measurement instrument 38. For example, the identification quantity may comprise a serial code of the signal generator 20 or of the measurement instrument 38. Alternatively or additionally, the identification quantity may comprise a product name that is associated with the signal generator 20 or with the measurement instrument 38.

The user interface $UI_{wd}$ may further comprise at least one graphic interface $G_{wd}$ via which the user may draw or upload a graphic representation (e.g. a heat map) of the signal or rather of the custom waveform to be generated.

The user request is then processed by the waveform definition module 32, and at least one signal parameter is generated based on the user request by the waveform definition module (step S2).

Therein, the at least one signal parameter is uniquely associated with the custom waveform. In other words, the at least signal parameter is generated such that the client-side signal generator 28 can unambiguously reproduce the custom waveform based on the at least one signal parameter. In some embodiments, the at least one signal parameter comprises a full set of IQ-data, i.e. in-phase data (I-data) and quadrature data (Q-data), wherein the full set of IQ-data completely describes the custom waveform.

In some embodiments, a set of signal parameters may be generated by the waveform definition module 32, wherein the set of signal parameters fully describes the custom waveform. For example, the set of signal parameters may comprise a set of waveform samples that correspond to the custom waveform.

The at least one signal parameter is forwarded to the waveform verification module 34. For example, the at least one signal parameter is not forwarded to the client 12 yet. Alternatively or additionally, the at least one signal parameter may be stored in the memory 36 of the server 14.

The waveform verification module 34 analyzes the custom waveform requested by the user based on the at least one signal parameter and generates a corresponding set of waveform analysis data (step S3). Generally speaking, the waveform analysis data comprises detailed information on properties of the custom waveform, e.g. a modulation type, an actual frequency content, an actual signal to noise ratio, an actual jitter content, an actual noise content, etc.

As is illustrated in FIG. 4, the waveform analysis data is then displayed to the user via a user interface $UI_{wv}$ of the waveform verification module 34 (step S4).

Similarly to the user interface $UI_{wd}$ of the waveform definition module 32, the user interface $UI_{wv}$ of the waveform verification module 34 may be implemented into a website that is accessible via a browser of the client 12. In other words, the user interface $UI_{wv}$ of the waveform verification module 34 may be established as a web-based user interface.

The user interface $UI_{wv}$ may be displayed on the display 22 of the computing device 18 and/or on the display 40 of the measurement instrument 38, respectively.

Based on the analysis data that is visualized via the user interface $UI_{wv}$, the user may decide whether the generated custom waveform is actually suitable for the requirements of a particular test setup for testing a device under test.

If the custom waveform meets the requirements, the user may decide to order and pay for that particular waveform based on the waveform analysis data by sending a user confirmation (step S5). The user may pay for the custom waveform before or after the at least one signal parameter is transferred to the client. In some embodiments, a payment may be part of the user confirmation.

The user may choose to lock the custom waveform or rather the at least one signal parameter associated with the custom waveform to a particular signal generator, e.g. the signal generator 20 or the measurement instrument 38. In some embodiments, the user may restrict the custom waveform to be operable only on the particular signal generator by entering the identification quantity described above into the user interface $UI_{wd}$ of the waveform definition module 32. Thus, the custom waveform may only be operable on the client-side signal generator 20 or the client-side measurement instrument 38.

In other words, the user may order the custom waveform only for one or several signal generators, but may pay a lower price for the custom waveform restricted in this way. Similarly, the user may decide to restrict the custom waveform to be operable only for a predefined time period, but may pay a lower price for the time-restricted custom waveform.

After the user confirmation is received by the server 14, the at least one signal parameter associated with the ordered waveform is transferred to the client 12 (step S6).

The at least one signal parameter may be stored in the memory 26 of the client-side computing device 18. Additionally or alternatively, the at least one signal parameter may be stored in the memory 30 of the signal generator 20 or of the measurement instrument 38.

The stored signal parameter or the stored set of signal parameters can then be utilized by the signal generator 28 in order to generate an output signal comprising the custom waveform (step S7).

If, however, the custom waveform does not meet the requirements, the user may send another user request in order to modify the custom waveform, and the at least one signal parameter may be adapted by the waveform definition module 32 (step S8).

In some embodiments, the at least one signal parameter is adapted without the user having to pay for the previously generated custom waveform (which did not fully meet the requirements).

The waveform definition module 32 may adapt the at last one signal parameter in real time, and the waveform verification module 34 may adapt the waveform analysis data in real time. Thus, the waveform verification module 34 may analyze the custom waveform and generate the associated waveform analysis data in real time, such that the user can immediately see the result of changes in the waveform analysis data via the user interface $UI_{wd}$.

In some embodiments, the user can adapt the custom waveform until the requirements of a particular test setup are matched or rather fulfilled in a satisfying manner without having to pay for any intermediate waveforms that do not meet the requirements of the user (to a certain extent). Instead, the user only has to pay for the particular custom waveform ordered via the user confirmation.

According to these embodiments, the user is provided with the specific waveform needed for a particular test setup, and only has to pay for waveforms that are actually necessary for that test setup. Moreover, the user does not have to pay for an indefinite subscription to that custom waveform, but may choose pay only for a time-limited subscription to that custom waveform.

The custom waveform may be available for download form the server 14 for a predefined time period. Moreover, the at least one signal parameter is stored in the memory 26, 30 only for a predefined time period or the at least one signal parameter stored becomes invalid once the time period has expired. Hence, the user can use the at least one signal parameter only for a certain time period.

Thus, the cloud-based signal generator system 10 and the method described above provide a convenient way of acquiring custom waveforms, wherein the user can adapt the custom waveform until the requirements of a particular test setup are met. The user is provided with an opportunity to check whether the generated custom waveform indeed matches the requirements of the test setup, and only has to pay for the final custom waveform that is ordered via the user confirmation.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used.

Different types of computing devices, such as the client computing device 18 and/or the server 14, were discussed above. The computing device to be described below, which can be the server 14 and/or the client computing device 18, is implemented as a device on a network. The description below is applicable to servers, personal computers, mobile phones, smart phones, tablet computers, embedded computing devices, and other devices that may be used to implement portions of embodiments of the present disclosure.

In its most basic configuration, an example computing device includes at least one processor and a system memory connected by a communication bus. The processor or portions thereof can be, for example, a microprocessor), a central processing unit (CPU), a digital signal processor (DSP), an application-specific integrated circuit (ASIC), a field-programmable gate array (FPGA), a system on a chip (SoC), or the like, or any combinations thereof.

Depending on the exact configuration and type of device, the system memory may be volatile or nonvolatile memory, such as read only memory ("ROM"), random access memory ("RAM"), EEPROM, flash memory, or similar memory technology. Those of ordinary skill in the art and others will recognize that system memory typically stores data and/or program modules or instructions that are immediately accessible to and/or currently being operated on by the processor. In this regard, the processor may serve as a computational center of the computing device by supporting the execution of instructions.

The computing device may include a network interface comprising one or more components for communicating with other devices over a network. Embodiments of the present disclosure may access basic services that utilize the network interface to perform communications using common network protocols. The network interface may also include a wireless network interface configured to communicate via one or more wireless communication protocols, such as WiFi, 2G, 3G, LTE, WiMAX, Bluetooth and/or the like. As will be appreciated by one of ordinary skill in the art, the network interface may represent one or more wireless interfaces or physical communication interfaces described above with respect to particular components of the computing device.

The computing device may include input devices, such as a keyboard, keypad, mouse, microphone, touch input device, touch screen, tablet, and/or the like. Such input devices may be coupled to the computing device by wired or wireless connections including RF, infrared, serial, parallel, Bluetooth, USB, or other suitable connections protocols using wireless or physical connections. Similarly, the computing device may also include output devices such as a display, speakers, printer, etc.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A cloud-based signal generator system, said signal generator system comprising a server being connectable to at least one client via a computer communication network, wherein the server includes processing circuitry and memory, said server comprising a waveform definition module, said waveform definition module including circuitry configured to receive a user request for a custom waveform, said waveform definition module further including circuitry configured to process said user request and to generate at least one signal parameter that is associated with the custom waveform based on said user request, wherein the at least one signal parameter is established such that a client-side signal generator is capable of generating an output signal comprising the custom waveform based on the at least one signal parameter, wherein said output signal is usable to test a device under test;

said server further comprising a waveform verification module, said waveform verification module including circuitry configured to analyze said custom waveform based on said at least one signal parameter generated by the waveform definition module that is integrated into said server, thereby generating waveform analysis data, the waveform analysis data being associated with said custom waveform, said waveform verification module including circuitry configured to forward said waveform analysis data to said at least one client, wherein said waveform analysis data comprises information on properties of said custom waveform generated based on the user request, said waveform definition module including circuitry configured to receive a further user request from the client for a modified custom waveform, said waveform definition module including circuitry configured to adapt the at least one signal parameter based on the further user request, thereby obtaining at least one adapted signal parameter, said waveform verification module including circuitry configured to analyze said modified custom waveform based on said at least one adapted signal parameter, thereby generating modified waveform analysis data, the modified waveform analysis data being associated with said modified custom waveform, and said waveform verification module including circuitry configured to forward said modified waveform analysis data to said client, wherein said modified waveform analysis data comprises information on properties of said modified custom waveform generated based on the further user request.

2. The signal generator system of claim 1, wherein said at least one signal parameter is uniquely associated with said custom waveform.

3. The signal generator system of claim 1, wherein said server is configured to receive a user confirmation from said client, and wherein said waveform definition module includes circuitry configured to forward said at least one signal parameter to said client based on said user confirmation.

4. The signal generator system of claim 1, wherein said waveform definition module comprises a memory, wherein said waveform definition module includes circuitry configured to store said at least one signal parameter in said memory.

5. The signal generator system of claim 4, wherein said waveform definition module includes circuitry configured to load said at least one signal parameter from said memory.

6. The signal generator system of claim 4, wherein said waveform verification module includes circuitry configured to load said at least one signal parameter from said memory.

7. The signal generator system of claim 1, wherein said at least one signal parameter comprises at least one IQ parameter.

8. The signal generator system of claim 1, wherein said waveform definition module comprises a user interface.

9. The signal generator system of claim 1, wherein said waveform verification module comprises a user interface.

10. The signal generator system of claim 1, wherein said user request comprises an identification quantity, wherein said identification quantity is unambiguously associated with a particular signal generator or with a particular type of signal generators.

11. The signal generator system of claim 10, wherein said waveform definition module includes circuitry configured to generate said at least one signal parameter based on said identification quantity.

12. The signal generator system of claim 1, wherein said client comprises a signal generator, wherein said signal generator is configured to generate an output signal comprising said custom waveform based on said at least one signal parameter.

13. The signal generator system of claim 1, wherein said waveform definition module includes circuitry configured to adapt said at least one signal parameter in real time, and wherein said waveform verification module is configured to adapt said waveform analysis data in real time.

14. A method for providing a signal comprising a custom waveform, said method comprising:

receiving a user request for a custom waveform from a client via a computer communication network;

processing said user request by waveform definition circuitry of a server; generating at least one signal parameter that is associated with the custom waveform based on said user request by said waveform definition circuitry of said server, wherein the at least one signal parameter is established such that a client-side signal generator is capable of generating an output signal comprising the custom waveform based on the at least one signal parameter, wherein said output signal is usable to test a device under test;

analyzing said custom waveform based on said at least one signal parameter by waveform verification circuitry of said server, thereby generating waveform analysis data, the waveform analysis data being associated with said custom waveform, wherein the waveform definition circuitry and the waveform verification circuitry are integrated into the same server;

forwarding said waveform analysis data to said client, wherein said waveform analysis data comprises information on properties of said custom waveform generated based on the user request;

receiving a further user request from the client for a modified custom waveform;

adapting the at least one signal parameter by said waveform definition circuitry of said server based on the further user request, thereby obtaining at least one adapted signal parameter;

analyzing said modified custom waveform based on said at least one adapted signal parameter by the waveform verification circuitry of said server, thereby generating modified waveform analysis data, the modified waveform analysis data being associated with said modified custom waveform; and forwarding said modified waveform analysis data to said client, wherein said modified waveform analysis data comprises information on properties of said modified custom waveform generated based on the further user request.

15. The method of claim 14, wherein said at least one signal parameter is uniquely associated with said custom waveform.

16. The method of claim 14, wherein said at least one signal parameter is forwarded to said client after a user confirmation is received from the client via said computer communication network.

17. The method of claim 14, wherein said waveform analysis data is visualized via a user interface of the waveform verification circuitry.

18. The method of claim 14, wherein said at least one signal parameter comprises at least one IQ parameter.

19. The method of claim 14, wherein said user request comprises an identification quantity, wherein said identification quantity is unambiguously associated with a particular signal generator or with a particular type of signal generators.

20. The method of claim 19, wherein said at least one signal parameter is generated based on said identification quantity.

21. A cloud-based signal generator system, said signal generator system comprising a server being connectable to at least one client via a computer communication network, wherein the server includes processing circuitry and memory, said server comprising a waveform definition circuit, said waveform definition circuit being configured to receive a user request, said user request comprising information on at least one of a desired modulation type, a desired frequency content, a desired signal to noise ratio, a desired jitter content, and a desired noise content, said waveform definition circuit further being configured to process said user request and to generate at least one signal parameter that is associated with a custom waveform based on said user request, wherein the at least one signal parameter is established such that a client-side signal generator is capable of generating an output signal comprising the custom waveform based on the at least one signal parameter, wherein said output signal is usable to test a device under test;

said server further comprising a waveform verification circuit, said waveform verification circuit being configured to analyze said custom waveform based on said at least one signal parameter generated by the waveform definition circuit that is integrated into the same server, thereby generating waveform analysis data, the waveform analysis data being associated with said custom waveform, and said waveform verification circuit being configured to forward said waveform analysis data to said at least one client, wherein said waveform analysis data comprises information on properties of said custom waveform, wherein said information on properties of said custom waveform relates to at least one of a modulation type, a frequency content, a signal to noise ratio, a jitter content, and a noise content, wherein said waveform verification circuit comprises a user interface, and wherein said user interface is configured to visualize said waveform analysis data said waveform definition module including circuitry configured to receive a further user request from the client for a modified custom waveform, said waveform definition module including circuitry configured to adapt the at least one signal parameter based on the further user request, thereby obtaining at least one adapted signal parameter, said waveform verification module including circuitry configured to analyze said modified custom waveform based on said at least one adapted signal parameter, thereby generating modified waveform analysis data, the modified waveform analysis data being associated with said modified custom waveform, and said waveform verification module including circuitry configured to forward said modified waveform analysis data to said client, wherein said modified waveform analysis data comprises information on properties of said modified custom waveform generated based on the further user request.

* * * * *